(12) United States Patent
Takemura

(10) Patent No.: US 8,809,927 B2
(45) Date of Patent: Aug. 19, 2014

(54) SEMICONDUCTOR MEMORY DEVICE

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/358,857

(22) Filed: Jan. 26, 2012

(65) Prior Publication Data

US 2012/0193697 A1     Aug. 2, 2012

(30) Foreign Application Priority Data

Feb. 2, 2011    (JP) ................................ 2011-020734

(51) Int. Cl.
     *H01L 27/108*      (2006.01)
(52) U.S. Cl.
     USPC ............. 257/296; 438/156; 438/241; 365/63; 365/185.05
(58) Field of Classification Search
     USPC ......... 257/296, 301, 303, 306, 328–330, 532; 438/156, 239, 241–244, 253, 268, 270, 438/396; 365/51, 63, 185.05, 205, 207
     See application file for complete search history.

(56) References Cited

U.S. PATENT DOCUMENTS 5,058,058 A * 10/1991 Yasuda et al. .................. 365/51
5,134,588 A * 7/1992 Kubota et al. ................. 365/207
5,138,437 A * 8/1992 Kumamoto et al. .......... 257/686
5,144,583 A * 9/1992 Oowaki et al. ................ 365/206
5,302,843 A    4/1994 Yamazaki
5,387,532 A    2/1995 Hamamoto et al.
5,396,450 A    3/1995 Takashima et al.
5,731,856 A    3/1998 Kim et al.
5,744,864 A    4/1998 Cillessen et al.
5,764,562 A    6/1998 Hamamoto
5,802,000 A    9/1998 Hamada (Continued)

FOREIGN PATENT DOCUMENTS

EP      1 737 044 A1     12/2006
EP      2 226 847 A2      9/2010

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Fernando L Toledo
*Assistant Examiner* — Bryan Junge
(74) *Attorney, Agent, or Firm* — Fish & Richardson P.C.

(57) ABSTRACT

A highly integrated DRAM is provided. A circuit for driving a memory cell array is formed over a substrate, a bit line is formed thereover, and a semiconductor region, word lines, and a capacitor are formed over the bit line. Since the bit line is located below the semiconductor region, and the word lines and the capacitor are located above the semiconductor region, the degree of freedom of the arrangement of the bit line is high. When an open-bit-line DRAM is formed, an area per memory cell less than or equal to $6F^2$, or when a special structure is employed for a cell transistor, an area per memory cell less than or equal to $4F^2$ can be achieved.

20 Claims, 8 Drawing Sheets

(56) References Cited

U.S. PATENT DOCUMENTS

| | | | |
|---|---|---|---|
| 5,828,594 A * | 10/1998 | Fujii | 365/63 |
| 5,877,522 A | 3/1999 | Kasai | |
| 5,888,868 A | 3/1999 | Yamazaki et al. | |
| 6,127,702 A | 10/2000 | Yamazaki et al. | |
| 6,147,918 A * | 11/2000 | Takashima et al. | 365/207 |
| 6,268,625 B1 * | 7/2001 | Lee | 257/331 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,831,852 B2 * | 12/2004 | Ishigaki et al. | 365/149 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,122,830 B2 | 10/2006 | Ishikawa et al. | |
| 7,183,603 B2 * | 2/2007 | Park | 257/298 |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,423,343 B2 | 9/2008 | Kurokawa | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,715,246 B1 * | 5/2010 | Kim | 365/189.14 |
| 7,732,819 B2 | 6/2010 | Akimoto et al. | |
| 7,772,053 B2 | 8/2010 | Kameshiro et al. | |
| 7,824,957 B2 * | 11/2010 | Umeda et al. | 438/104 |
| 7,910,490 B2 | 3/2011 | Akimoto et al. | |
| 7,932,521 B2 | 4/2011 | Akimoto et al. | |
| 7,977,725 B2 * | 7/2011 | Yoon et al. | 257/306 |
| 8,339,828 B2 * | 12/2012 | Yamazaki et al. | 365/72 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0250743 A1 * | 10/2009 | Kim | 257/321 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0062433 A1 | 3/2011 | Yamazaki | |
| 2011/0084267 A1 | 4/2011 | Yamazaki et al. | |
| 2011/0101334 A1 | 5/2011 | Yamazaki et al. | |
| 2011/0101351 A1 | 5/2011 | Yamazaki | |
| 2011/0121878 A1 | 5/2011 | Kato et al. | |
| 2011/0122670 A1 | 5/2011 | Yamazaki et al. | |
| 2011/0122673 A1 | 5/2011 | Kamata et al. | |
| 2011/0127524 A1 | 6/2011 | Yamazaki et al. | |
| 2011/0128777 A1 | 6/2011 | Yamazaki et al. | |
| 2011/0134683 A1 | 6/2011 | Yamazaki et al. | |
| 2011/0147737 A1 | 6/2011 | Yamazaki et al. | |
| 2011/0156025 A1 | 6/2011 | Shionoiri et al. | |
| 2011/0156027 A1 | 6/2011 | Yamazaki et al. | |
| 2011/0156028 A1 | 6/2011 | Yamazaki et al. | |
| 2011/0156117 A1 | 6/2011 | Yamazaki et al. | |
| 2011/0157961 A1 | 6/2011 | Yamazaki et al. | |
| 2011/0187410 A1 | 8/2011 | Kato et al. | |
| 2011/0227074 A1 | 9/2011 | Kato et al. | |
| 2011/0260158 A1 | 10/2011 | Takemura | |
| 2012/0057396 A1 | 3/2012 | Yamazaki et al. | |
| 2012/0063208 A1 | 3/2012 | Koyama et al. | |
| 2012/0063209 A1 | 3/2012 | Koyama et al. | |
| 2012/0075917 A1 | 3/2012 | Takemura | |
| 2012/0081948 A1 | 4/2012 | Takemura | |
| 2012/0112257 A1 | 5/2012 | Kato | |
| 2012/0182790 A1 | 7/2012 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |

(56) References Cited

FOREIGN PATENT DOCUMENTS

| JP | 2002-076356 A | 3/2002 |
|---|---|---|
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characterisics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H. "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg—Silicon Technology," SID Digest '04 : SID International Symposium Digest of Technical Papers, 2004, vol. 35, pp. 860-863.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Kimizuka, N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3. 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

(56) References Cited

OTHER PUBLICATIONS

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors using Amorphous Oxide Semiconductors," Nature, Nov. 25, 2004, vol. 432, pp. 488-492.

Nomura, K et al., "Carrier transport in transparent oxide semiconductor with intrinsic structual randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Shukuri, S et al., "A Complementary Gain Cell Technology for sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

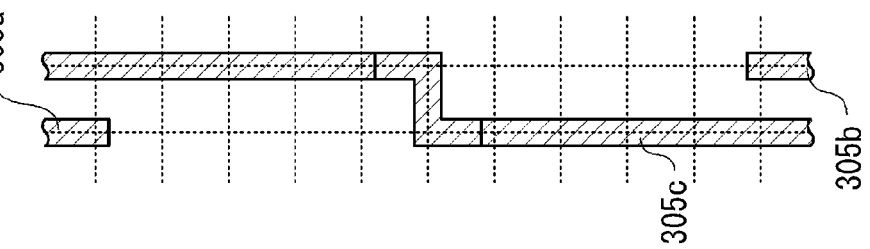
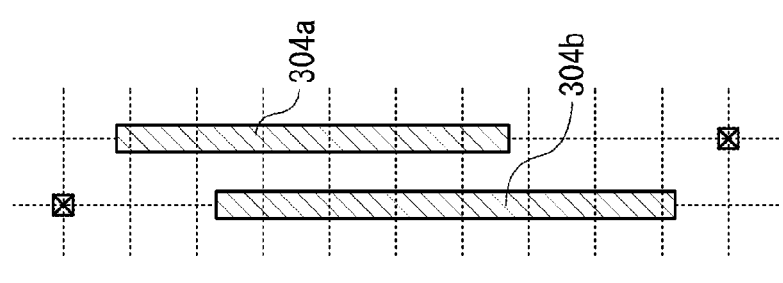
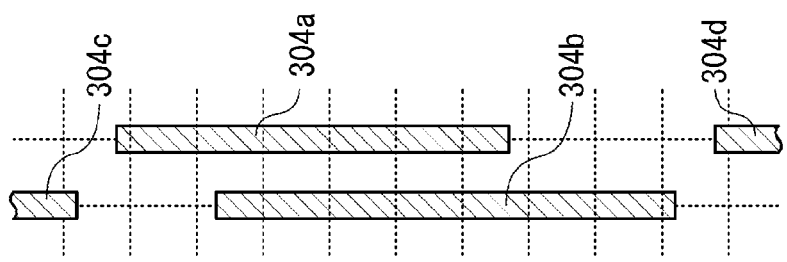
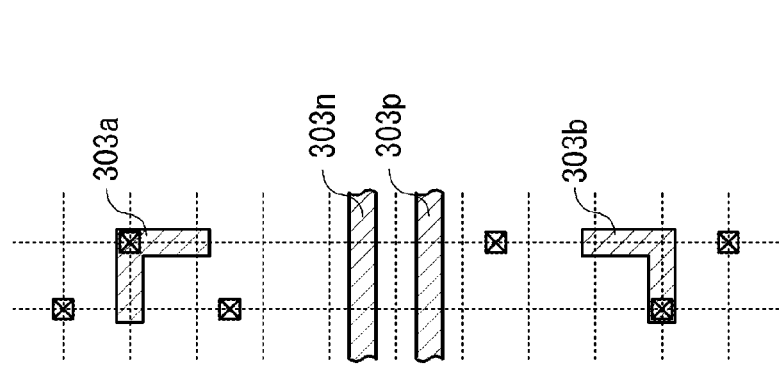
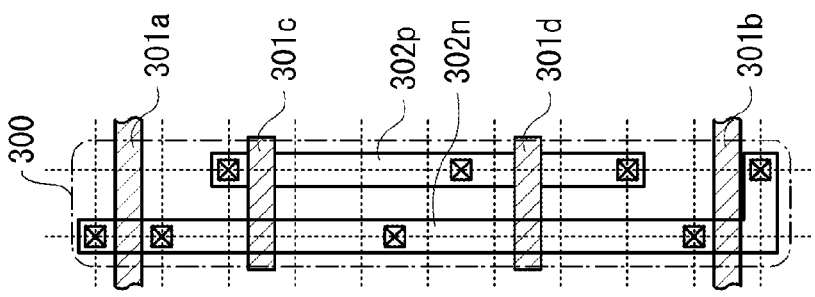

SEMICONDUCTOR MEMORY DEVICE

BACKGROUND OF THE INVENTION

1. Field of the Invention

The present invention relates to a semiconductor memory device.

2. Description of the Related Art

Dynamic random access memories (DRAMs) are widely used as typical semiconductor memory devices. DRAMs are divided into two kinds of DRAMs by the difference in signal detecting method of bit lines, that is, open-bit-line DRAMs and folded-bit-line DRAMs (for example, see Patent Document 1).

In the folded-bit-line DRAM, memory cells are provided in half of all intersections of word lines and bit lines, and thus the area per memory cell is greater than or equal to $8F^2$ (F is a feature size). In contrast, in the open-bit-line DRAM, ideally, a contact can be shared, and thus the area per memory cell can be reduced to $6F^2$.

In addition, as a formation method of a capacitor in a DRAM, two kinds of formation methods, that is, a trench capacitor method in which a deep hole is formed in a silicon substrate, and a stacked capacitor method in which an electrode is stacked above a transistor are used. The stacked capacitor method has an advantage over the trench capacitor method when the feature size is small.

REFERENCE

Patent Documents

[Patent Document 1] U.S. Pat. No. 5,396,450
[Patent Document 2] U.S. Pat. No. 5,802,000
[Patent Document 3] U.S. Pat. No. 5,877,522
[Patent Document 4] U.S. Pat. No. 5,302,843
[Patent Document 5] U.S. Pat. No. 7,772,053
[Patent Document 6] U.S. Pat. No. 5,764,562

SUMMARY OF THE INVENTION

Manufacturing of an open-bit-line DRAM using a stacked capacitor method is a burden on a circuit design and device characteristics. In other words, since a capacitor and a bit line are located above a transistor, it is necessary that the bit line is formed to be oblique so as to avoid overlapping with the capacitor (Patent Document 2), or an auxiliary electrode is provided (Patent Document 3).

For example, in Patent Document 3, an auxiliary electrode is needed for connection between a transistor and a bit line; in Patent Document 2, it is necessary that a bit line and a word line intersect each other at an angle which is not a right angle (as a result, a memory cell is a parallelogram). In short, a space which is not used or an extra process is needed. As a result, for example, in the case where the bit line is provided to be oblique, the area of one memory cell is larger than $6F^2$ whatever optimization is performed.

This is because the bit line and the capacitor are located over the transistor, and it is required that the bit line is provided so as to avoid overlapping with the capacitor.

In addition, since the word line, the capacitor, and the bit line are located above the transistor, a parasitic capacitance between the word line and the bit line, and a parasitic capacitance between the capacitor and the bit line are increased. In the DRAM, the capacitance of the capacitor is determined depending on the ratio with respect to the parasitic capacitance of the bit line, and thus, when the parasitic capacitance of the bit line is increased, the capacitance of the capacitor is inevitably increased. However, in a memory cell which is particularly miniaturized, it has been difficult to form a capacitor having a sufficient capacitance.

An object of the present invention is to solve at least one of such problems. For example, an object of the present invention is to provide a semiconductor memory device whose area can be reduced as much as possible, the structure of a circuit of the semiconductor memory device and a manufacturing method thereof. An object of the present invention is to provide a semiconductor memory device in which a parasitic capacitance of a bit line is reduced, the structure of a circuit of the semiconductor memory device, and a manufacturing method thereof. An object of the present invention is to provide a semiconductor device having high reliability and high characteristics and a manufacturing method thereof.

An embodiment of the present invention is a semiconductor memory device including a memory cell array. The memory cell array includes a bit line formed over a substrate, an island-shaped semiconductor region formed over the bit line, a gate insulator formed over the island-shaped semiconductor region, and a capacitor formed over word lines are formed over the gate insulator and the island-shaped semiconductor region. The number of the word lines overlapping with the one island-shaped semiconductor region is at least two. An electrode for connection with the bit line is provided between regions of the island-shaped semiconductor region that overlap with the two word lines.

Further, one embodiment of the present invention is a semiconductor memory device including a memory cell array. The memory cell array includes a bit line provided over a substrate, an island-shaped semiconductor region provided over the bit line, a gate insulator provided over the island-shaped semiconductor region, two word lines provided over the gate insulator and the island-shaped semiconductor region, and a capacitor provided over the island-shaped semiconductor region. An area of the island-shaped semiconductor region which overlaps with the bit line occupies 80% or more of the area of the island-shaped semiconductor region.

One embodiment of the present invention is a semiconductor memory device including a memory cell array. The memory cell array including a sense amplifier circuit provided over a substrate, first to third bit lines provided over the sense amplifier circuit, an island-shaped semiconductor region provided over the first bit line, a gate insulator provided over the island-shaped semiconductor region, two word lines provided over the gate insulator and the island-shaped semiconductor region, and a capacitor provided over the island-shaped semiconductor region. The first bit line and the second bit line are connected to the sense amplifier circuit, and the third bit line is provided between an end of the first bit line and an end of the second bit line.

Here, a circuit for driving the memory cell array (a sense amplifier, a decoder, or the like) may be provided below the bit line. In addition, a position where the island-shaped semiconductor region is formed is not limited to that over a flat surface, and the island-shaped semiconductor region may be provided over a recessed portion or a projected portion. Further, the heights or depths of adjacent bit lines may be different from each other.

In the above structure, the transistor is formed using the island-shaped semiconductor region and the word line. As described above, the bit line is located below the transistor, and the word line and the capacitor are located above the transistor. Therefore, the bit line can be provided irrespective of the location of the capacitor, and thus, an extremely efficient layout can be obtained and the area of one memory cell can be ideally reduced to $6F^2$.

In addition, when the island-shaped semiconductor region is provided in the recessed portion, the word line is mainly formed at the side surface of the recessed portion, but a contact plug to the bit line is provided in a contact hole formed in a bottom surface of the recessed portion, and the area of one memory cell can be ideally reduced to $4F^2$.

Note that in the case where the word line is provided at the side surface of the recessed portion or the projected portion, a channel length of the transistor whose gate is formed using the word line is substantially equal to the height of the side surface or the depth of the recessed portion or the projected portion. Therefore, for example, when such a height or depth is appropriately determined, the integration degree is not reduced, the channel length can be larger than the feature size, and a short-channel effect can be suppressed.

In addition, in the above structure, the bit line is located in a position apart from the capacitor and the word line, and thus, a parasitic capacitance between the bit line and the capacitor or the word line can be reduced. When the parasitic capacitance of the bit line is reduced, the capacitance of the capacitor provided in a memory cell can be reduced in proportion thereto.

Note that in the above structure, since the bit line is located below the transistor and there is no structure that becomes an obstruction, the depth at which the bit line is provided can be arbitrarily determined. Needless to say, the formation of the bit line in a position apart from another wiring makes it possible to further reduce the parasitic capacitance. In addition, when the depths of the bit lines adjacent to each other are different from each other, a parasitic capacitance between the adjacent bit lines can also be reduced.

Further, when a circuit for driving a memory array is provided below the memory cell array, the area of a chip can be reduced. The area of a driver circuit occupies 20% to 50% of the area of a surface of a usual DRAM chip. When the driver circuit and the memory cell array are provided to overlap with each other, the area of the chip can be reduced, and a larger number of memory cells can be formed compared to the case of the usual DRAM chip having the same area.

BRIEF DESCRIPTION OF THE DRAWINGS

In the accompanying drawings:

FIGS. 6A to 6D illustrate a layout example of a semiconductor memory device of the present invention;

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In addition, ordinal numbers such as "first" and "second" are used to avoid confusion among components and do not necessarily mean the order. For example, another interlayer insulator may be provided below a first interlayer insulator, or another contact plug may be provided between a first contact plug and a second contact plug.

(Embodiment 1)

Figure 1:
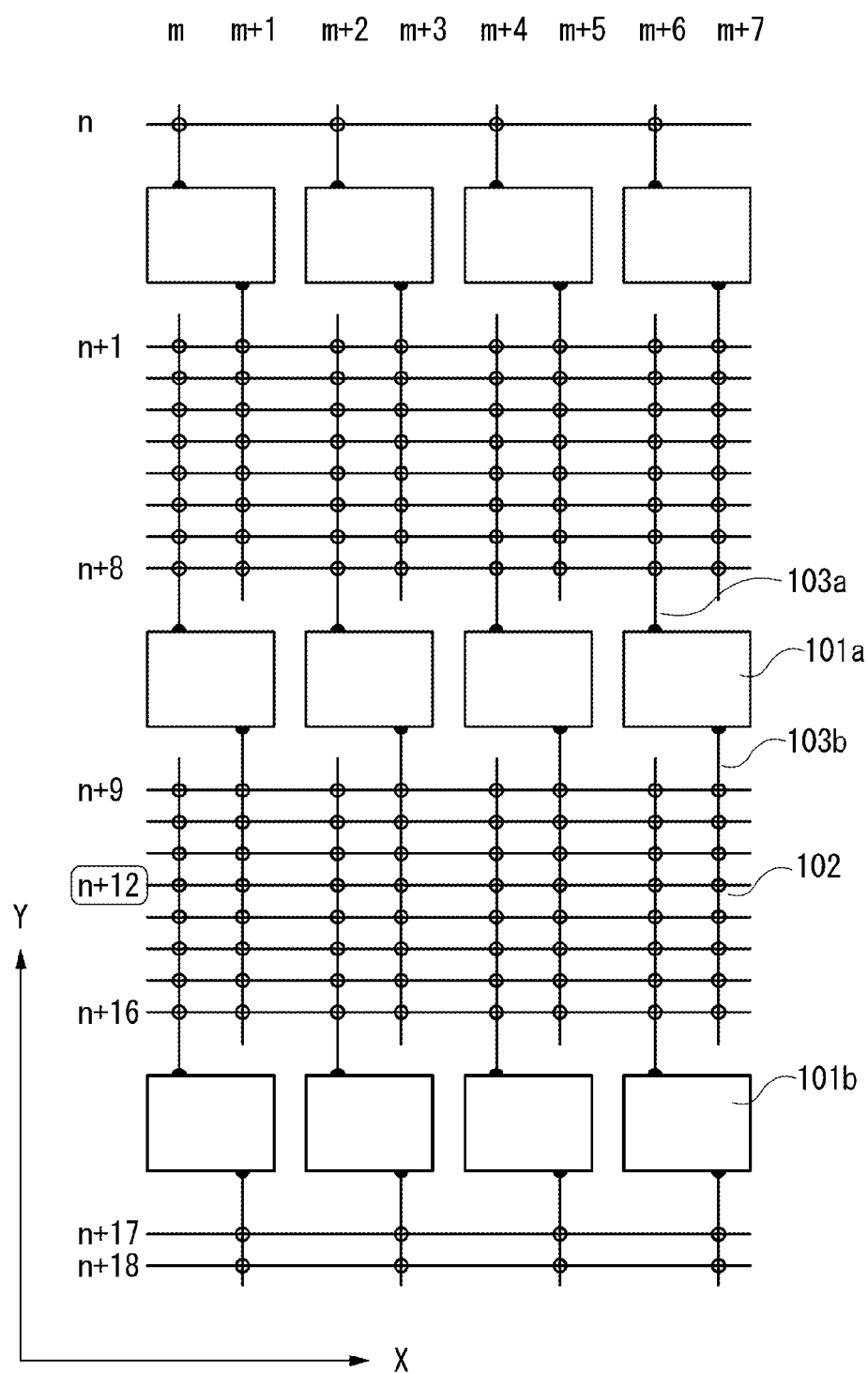
FIG. 1 illustrates an example of circuit arrangement applied to a semiconductor memory device of the present invention.
Figure 2:
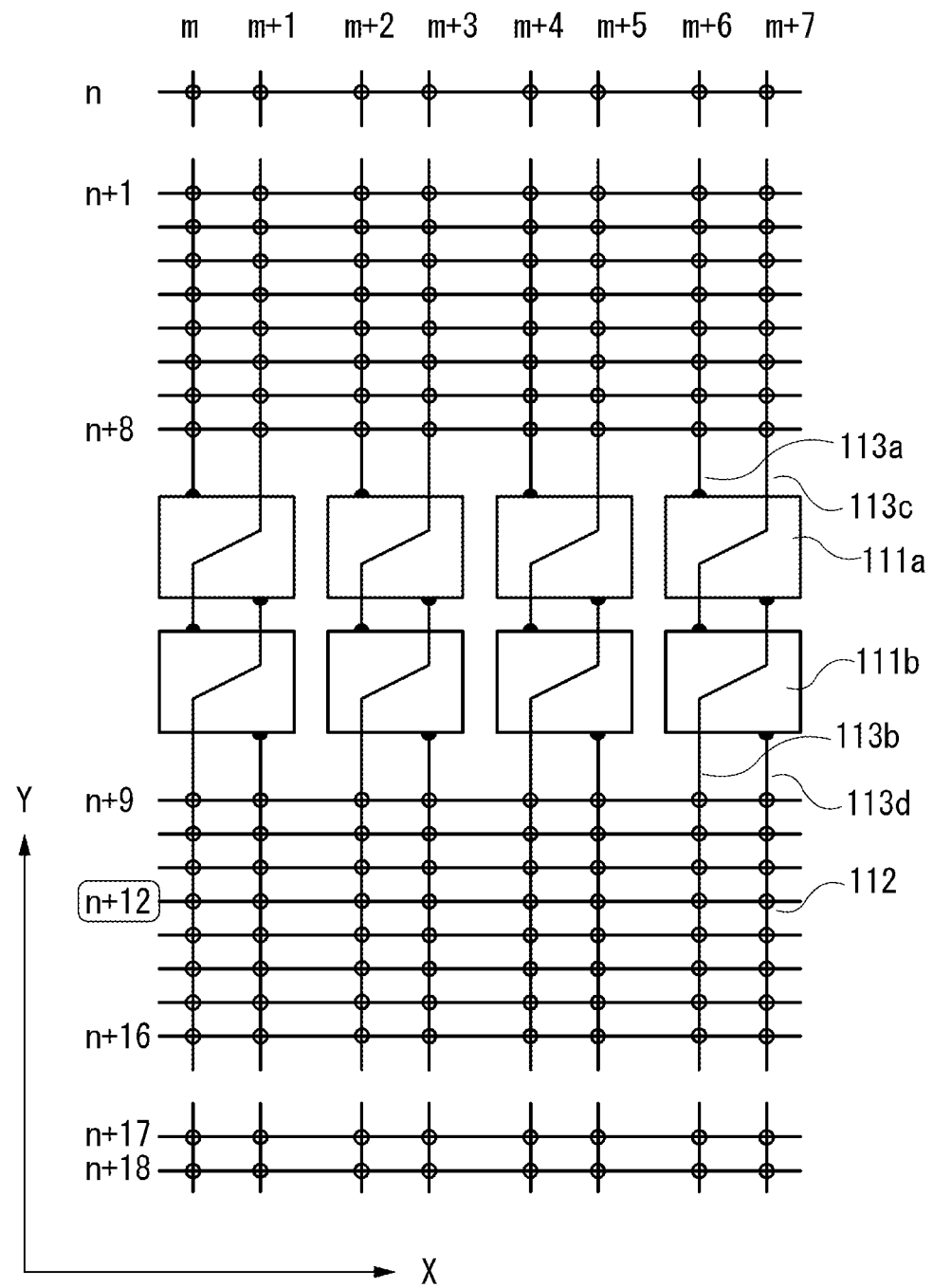
FIG. 2 illustrates an example of circuit arrangement applied to a semiconductor memory device of the present invention.

FIG. 1 and FIG. 2 each illustrate an example of circuit arrangement of a DRAM to which the present invention is applied. In FIG. 1 and FIG. 2, lines extending in a Y direction indicate bit lines and m to (m+7) columns are illustrated. Further, in FIG. 1 and FIG. 2, lines extending in an X direction indicate word lines and n to (n+18) rows are illustrated. Furthermore, in FIG. 1 and FIG. 2, circles located on intersections of lines indicate memory cells and rectangles each connected to one end of the line indicate sense amplifiers.

FIG. 1 illustrates circuit arrangement called a relaxed-open-bit-line type in open-bit-line DRAMs. Bit lines 103a and 103b connected to a sense amplifier 101a are provided to extend upward and downward in the drawing, respectively, from the sense amplifier 101a.

For example, in order to read data of a memory cell 102 in the (n+12) row and the (m+7) column, the following operations are performed: the word line in the (n+12) row is activated and charge accumulated in memory cells in the (n+12) row including the memory cell 102 is released to the bit lines; and then, sense amplifiers provided between the (n+8) row and the (n+17) row are operated and each amplify a potential difference between bit lines connected thereto.

In these sense amplifiers, for example, the sense amplifier 101a is used for reading the data of the memory cell 102. The sense amplifier 101a compares a potential of the bit line 103a with a potential of the bit line 103b, and when the word line in the (n+12) row is activated, only the potential of the bit line 103b is changed and the potential of the bit line 103a is hardly changed. Therefore, the sense amplifier 101a amplifies and outputs the potential of the bit line 103b.

On the other hand, other sense amplifiers operated, for example, a sense amplifier 101b is not involved in reading of data. However, when the word line in the (n+12) row is activated, the charge accumulated in the memory cells in the (n+12) row is released to the bit lines, and the memory cells need to be charged again; therefore, the sense amplifier 101b amplifies the potentials of the bit lines. Patent Document 1 may be referred to for details of the operation of the open-bit-line DRAM.

FIG. 2 illustrates different circuit arrangement of an open-bit-line DRAM. Here, for example, two sense amplifiers are provided between the (n+8) row and the (n+9) row. In general, it is difficult to form a sense amplifier within a width corresponding to one column of a bit line (2F), and thus, a sense amplifier is formed to have a width corresponding to two or more columns of bit lines (4F or more). In this example, a sense amplifier is formed to have a width corresponding to two columns of bit lines. Further, two sense amplifiers are formed to be adjacent to each other in the width corresponding to two columns of bit lines.

In this example, for example, a sense amplifier 111a compares a potential of a bit line 113a in the (m+6) column with a potential of a bit line 113b in the (m+6) column, and a sense amplifier 111b compares a potential of a bit line 113c in the (m+7) column with a potential of a bit line 113d in the (m+7) column.

In the circuit illustrated in FIG. 1, a portion where the bit lines are not densely arranged (i.e., a portion where only one column of a bit line is provided in a space for two columns of bit lines) exists at an end of a matrix; in FIG. 2, bit lines can be arranged densely in the entire the matrix.

In the circuit of FIG. 2, in order to read data of a memory cell 112 in the (n+12) row and the (m+7) column, the following operations are performed: the word line in the (n+12) row is activated and charge accumulated in the memory cells in the (n+12) row including the memory cell 112 is released to the bit lines; and then, sense amplifiers provided between the (n+8) row and the (n+9) row are operated and each amplify a potential different between the bit lines connected to the sense amplifier.

In these sense amplifiers, for example, the sense amplifier 111b is used for reading the data of the memory cell 112. The sense amplifier 111b compares the potential of the bit line 113c with the potential of the bit line 113d, and when the word line in the (n+12) row is activated, only the potential of the bit line 113d is changed and the potential of the bit line 113c is hardly changed. Therefore, the sense amplifier 111b amplifies and outputs the potential of the bit line 113d.

On the other hand, other sense amplifiers operated, for example, a sense amplifier 111a is not involved in reading of data. However, when the word line in the (n+12) row is activated, the charge accumulated in the memory cells in the (n+12) row is released to the bit lines, and the memory cells need to be charged again; therefore, the sense amplifier 111a amplifies the potentials of the bit lines.

When a circuit is a miniaturized, there is a problem in that variation in a threshold voltage of a transistor is increased due to statistical fluctuation of impurity concentration, which strongly influences the transistor used for the sense amplifier.

It is necessary that the sense amplifier amplifies a minute potential difference. In addition, it is necessary that the variation in the threshold voltage of the transistor included in the sense amplifier is smaller than the potential different which is input. The above variation in the threshold voltage is in inverse proportion to the square root of the area of a channel. When the area of the channel quadruples, the variation in the threshold voltage is reduced by half. Therefore, an excessive reduction in the channel area of the transistor included in the sense amplifier interferes with the amplification of the potential difference.

For the above-described reason, it is necessary that the channel area of one transistor included in the sense amplifier is $8F^2$ or more, preferably $25F^2$ or more; thus, it is difficult to form the sense amplifier in a region for two columns of bit lines. The relaxed open-bit-line-type circuit arrangement as illustrated in FIG. 1 is not practical under such conditions. Instead, circuit arrangement illustrated in FIG. 3 obtained by expanding the circuit arrangement illustrated in FIG. 2 is employed.

Figure 3:
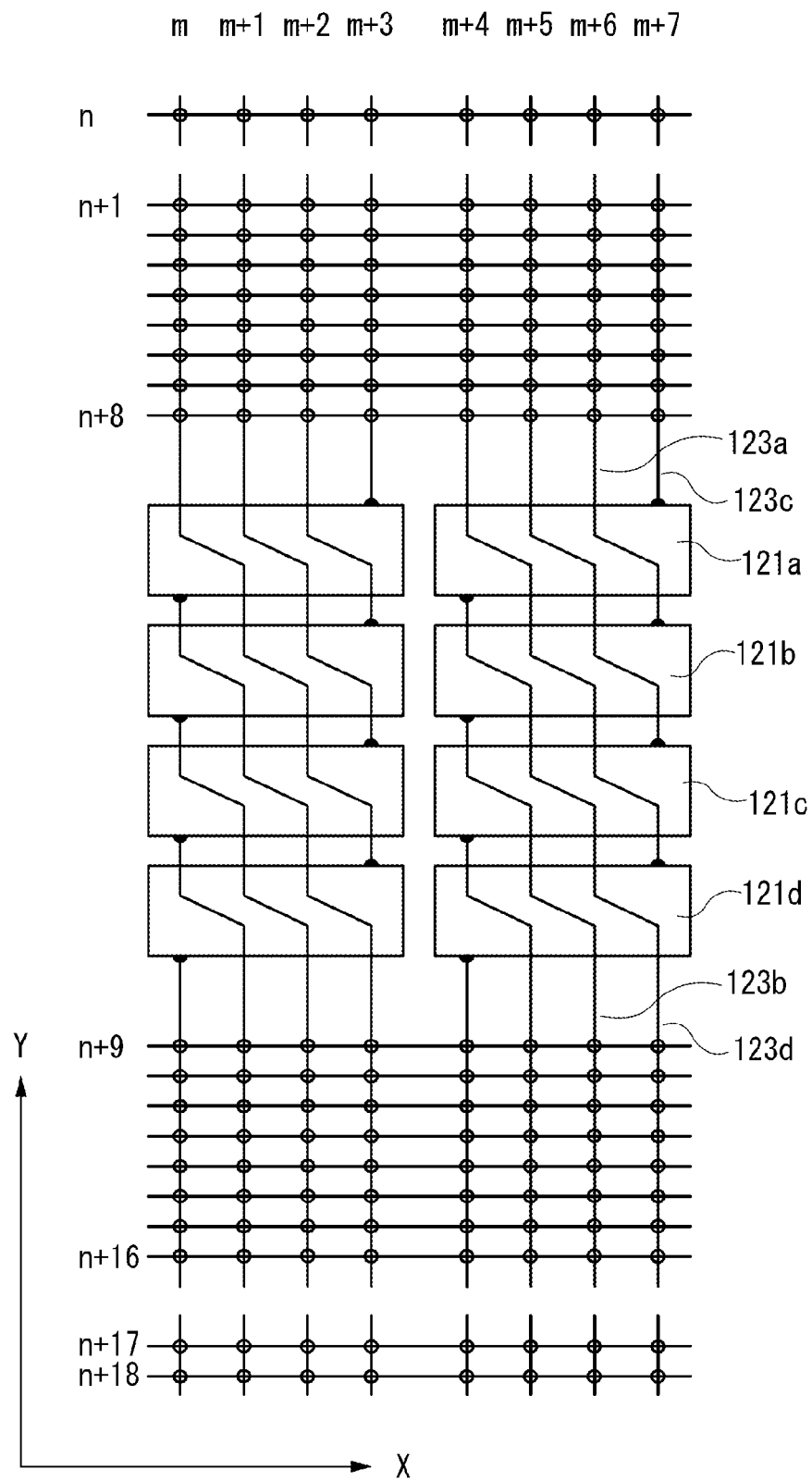
FIG. 3 illustrates an example of circuit arrangement applied to a semiconductor memory device of the present invention.

In the circuit arrangement illustrated in FIG. 3, one sense amplifier needs a width corresponding to four columns of bit lines, and therefore, four sense amplifiers (sense amplifiers 121a to 121d) are provided within a width corresponding to four columns of bit lines to adjacent to each other. In this example, for example, the sense amplifier 121a compares a potential of a bit line 123c in the (m+7) column with a potential of a bit line 123d in the (m+7) column, and the sense amplifier 121b compares a potential of a bit line 123a in the (m+6) column with a potential of a bit line 123b in the (m+6) column.

The same applies to the case where the sense amplifier needs a larger area. Note that when the transistor having a large channel area is used as described above, the area occupied by the sense amplifier is large. However, in this embodiment, as described below, the use of the transistor having a large channel area does not cause a reduction in integration degree because a memory cell is provided over a sense amplifier in three dimensions.

In addition, in the sense amplifier including the transistor having a large channel area, a gate capacitance of the transistor is large and variation in the potential of a bit line is small. However, since the variation in the threshold voltage is reduced as the channel area is increased, a probability that an error occurs at the time of amplification of a potential difference is reduced.

For example, when the channel area of the transistor in the sense amplifier is increased hundred times and the gate capacitor of the transistor in the sense amplifier is increased, the variation in the potential of the bit line is slightly reduced. However, the variation in the potential of the bit line is not reduced by half. On the other hand, since the variation in the threshold voltage is reduced to one tenth when the channel area of the transistor is increased hundred times, even when the variation in the potential of the bit line is slightly reduced, the possibility that an error occurs at the time of amplification of a potential different can be reduced to approximately one tenth.

The sense amplifier which can be used in FIG. 1 or FIG. 2 may be a flip-flop circuit to which a switching element is added. Examples thereof are illustrated in FIGS. 6A to 6D. FIGS. 6A to 6D illustrate a layout of wirings of a sense amplifier and the like which can be used for the circuit arrangement in FIG. 2. A known technique for manufacturing a semiconductor integrated circuit can be referred to for details of manufacturing of the sense amplifier having such a structure.

FIG. 6A illustrates examples of element formation regions formed using a semiconductor substrate or the like and first wirings and the like provided thereover. As the semiconductor substrate, a substrate having a surface including single crystal silicon, single crystal germanium, single crystal gallium arsenide or the like is preferably used. A region 300 surrounded by an alternate long and short dashed line in FIG. 6A indicates a region where a sense amplifier is formed. In the region 300, an element formation region 302n and an element formation region 302p are formed, and first wirings 301a to 301d are formed to overlap therewith.

The first wirings 301a to 301d each function as a gate of a transistor. An n-type or p-type impurity can be added by doping in a self-aligned manner using the first wirings 301a to 301d. Here, an n-channel transistor and a p-channel transistor are formed in the element formation region 302n and the element formation region 302p, respectively. Further, as illustrated in the drawing, contact plugs used for connection with an upper layer are provided in the element formation region 302n and the element formation region 302p.

FIG. 6B illustrates a layout of second wirings 303a, 303b, 303n, and 303p which are formed over the circuit illustrated in FIG. 6A, and contact plugs for connection with an upper layer. The second wirings 303a and 303b are each provided for connection between a drain of the n-channel transistor and a drain of the p-channel transistor, and the second wirings 303n and 303p are connected to sources of the n-channel transistor and the p-channel transistor to supply power supply of the sense amplifier.

Further, the contact plugs are provided for connection between the first wiring 301c and the upper layer, between the first wiring 301d and the upper layer, between the second wiring 303a and the upper layer, and between the second wiring 303b and the upper layer.

FIG. 6C1 illustrates a layout of third wirings formed over the circuit illustrated in FIG. 6B. A third wiring 304a connects a gate of an inverter formed in a lower portion of the drawing with an output of an inverter formed in an upper portion of the drawing, a third wiring 304b connects a gate of the inverter formed in the upper portion of the drawing and an output of the inverter formed in the lower portion of the drawing.

The third wirings 304c and 304d in FIG. 6C1 are connected to the contact plugs from the lower layer. The third wirings 304c and 304d are bit lines, and for example, correspond to the bit lines 103a and 103b in FIG. 1. This circuit may be applied to the sense amplifiers 101a and 101b in FIG. 1. Note that in the case where the circuit is used in the sense amplifiers 111a and 111b of FIG. 2, another wiring is needed in an upper layer, and thus, contact plugs are provided in portions where the third wirings 304c and 304d of FIG. 6C1 are formed as illustrated in FIG. 6C2.

FIG. 6D illustrates a layout of fourth wirings 305a to 305c formed over the circuit illustrated in FIG. 6C2. The fourth wiring 305a to 305c are bit lines, and for example, correspond to the bit lines 113a to 113c of FIG. 2, respectively. Note that the fourth wiring 305c passes through the sense amplifier illustrated in FIGS. 6A to 6D and is not connected to the sense amplifier of FIGS. 6A to 6D. The sense amplifier having the circuit structure of FIG. 3 can also be formed in the above manner.

In addition, the structure of FIG. 6D can be applied to the sense amplifiers 101a and 101b of FIG. 1 in the case where the fourth wiring 305c is not provided; for example, the fourth wirings 305a and 305b correspond to the bit lines 103a and 103b of FIG. 1, respectively.

In the semiconductor device of this embodiment, the memory cell is formed over the circuit including the sense amplifier and the like described above. A manufacturing process thereof is described with reference to FIGS. 4A to 4D and FIGS. 5A and 5B. FIGS. 4A and 4B and FIGS. 5A and 5B each illustrate one cross section parallel to the bit line of the semiconductor memory device.

First, a semiconductor circuit 202 including a sense amplifier is formed on a substrate 201 as described above. Although two layers of wirings are used in the semiconductor circuit 202 in this example, three or more layers of wirings may be used as described with reference to FIGS. 6A to 6D. A first insulator 203 having an appropriate thickness and a first contact plug 204 are formed.

After that, a bit line 205 is formed in contact with the first contact plug. Further, a second insulator 206 having an appropriate thickness and a second contact plug 207 connected to the bit line are formed thereover. The thickness of the first insulator 203 and the thickness of the second insulator 206 are important when the parasitic capacitance of the bit line is determined. The first insulator 203 and the second insulator 206 each preferably have a thickness of 100 nm to 1 μm. Further, the first insulator 203 and the second insulator 206 are each preferably formed using a material having a relatively low dielectric constant such as silicon oxide.

Figure 4A:
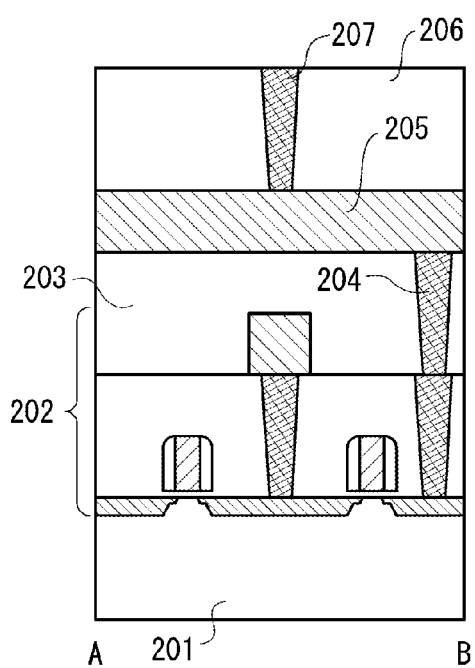
FIGS. 4A to 4D illustrate an example of a method for manufacturing a semiconductor memory device of the present invention.
Figure 4B:
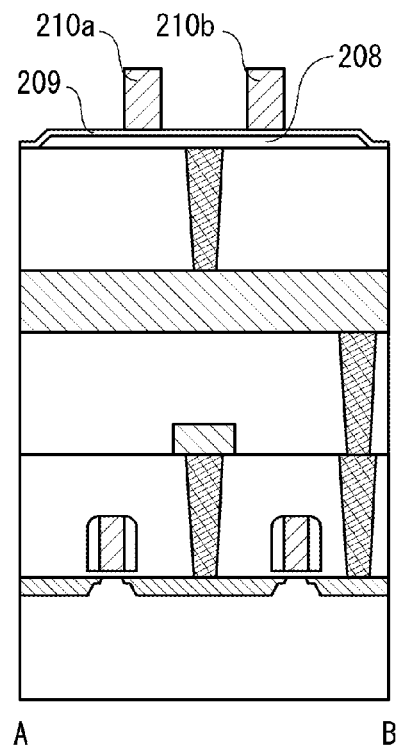
Figure 4C:
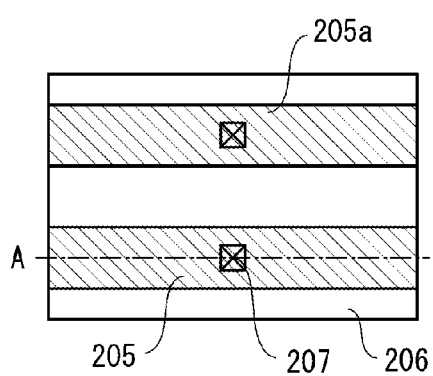

FIG. 4C illustrates a schematic view of the semiconductor device in FIG. 4A which is seen from above. A cross section taken along line A-B in FIG. 4C corresponds to FIGS. 4A and 4B. An adjacent bit line 205a is also illustrated in FIG. 4C.

After that, an island-shaped semiconductor region 208 is formed and a gate insulator 209 is formed to cover the semiconductor region 208. The thickness of the semiconductor region 208 and the thickness of the gate insulator 209 can be determined appropriately, but are each preferably small when a channel length of the transistor is small, and are preferably one fiftieth to one fifth of the channel length in equivalent oxide thickness (EOT).

The gate insulator 209 preferably has a small thickness which does not cause a problem of tunnel current or the like. In addition, the gate insulator 209 may be formed using a material having a dielectric constant of 10 or more.

There is no particular limitation on the kind of a semiconductor used for the semiconductor region 208 but a semiconductor having a mobility of 5 cm$^2$/Vs or more is preferable. For example, polycrystalline silicon, polycrystalline germanium, polycrystalline silicon germanium, indium oxide, an oxide including indium oxide to which another metal element is added, gallium nitride, a compound including gallium nitride to which oxygen is added, gallium arsenide, indium arsenide, zinc arsenide, or the like may be used.

Note that it is preferable that off-state resistance of a cell transistor is increased because the refresh interval of a memory cell can be lengthened. For example, in the case of off-state resistance which is one million times of that of a usual transistor, a cell transistor can be used practically without refresh operation.

In order to obtain such a very high off-state resistance, bulk silicon (having a band gap of 1.1 eV) is not enough, and it is necessary to use a wide-band-gap semiconductor having a band gap greater than or equal to 2.5 eV and less than or equal to 4 eV, preferably greater than or equal to 3 eV and less than or equal to 3.8 eV. For example, an oxide semiconductor such as indium oxide or zinc oxide, a nitride semiconductor such as gallium nitride, a sulfide semiconductor such as zinc sulfide, or the like may be used.

The off-state resistance is proportional to the concentration of carriers which are thermally excited. Even in the state where there is no carrier caused by a donor or an acceptor (an intrinsic semiconductor), since the band gap of a bulk silicon is 1.1 eV, the concentration of thermally excited carriers at room temperature (300 K) is approximately $1\times10^{11}$ cm$^{-3}$.

On the other hand, the concentration of thermally excited carriers of a semiconductor having a band gap of 3.2 eV is approximately $1\times10^{-7}$ cm$^{-3}$. When the semiconductor having a band gap of 3.2 eV and silicon have the same electron mobility, the resistivity of the semiconductor having a band gap of 3.2 eV is 18 orders of magnitude higher than that of the silicon because resistivity is inversely proportional to a carrier concentration.

Note that it is preferable that the concentration of carriers caused by a donor or an acceptor is as low as possible and lower than or equal to $1\times10^{12}$ cm$^{-3}$. The threshold voltage of the transistor is determined by the carrier concentration.

In addition, it is reported that even in the case of the silicon, when the silicon has an extremely small thickness, the band gap is expanded owing to a quantum mechanical effect (see Patent Document 5).

Figure 4D:
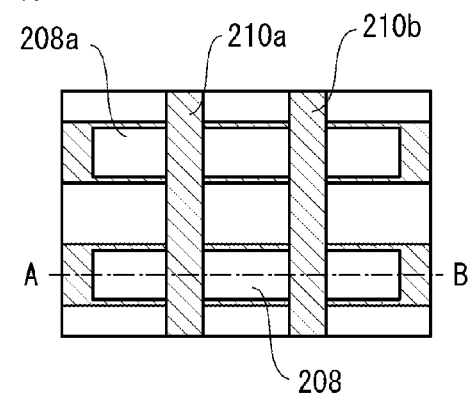

After the semiconductor region 208 and the gate insulator 209 are formed, word lines 210a and 210b are formed. FIG. 4D illustrates a schematic view of this state seen from the above. FIG. 4D also illustrates an adjacent semiconductor region 208a. The word lines 210a and 210b each function as the gate of the cell transistor in the memory cell.

In general, when a semiconductor integrated circuit is provided in a lower layer, noise generated by the semiconductor integrated circuit interferes with the operation of a transistor in an upper layer in some cases. To solve the problem, it is desirable to provide a shield layer below the transistor in the upper layer so that the shield layer absorbs the noise. As illustrated in FIGS. 4B and 4D, the bit line 205 and the semiconductor region 208 are provided to overlap with each other, whereby the bit line 205 serves as a shield layer to absorb noise. An area where the semiconductor region 208 and the bit line 205 overlap with each other occupies 80% or more of the area of the semiconductor region 208.

Next, an impurity is injected to the semiconductor region 208 by an ion injection method or the like using the word lines 210*a* and 210*b* as masks, so that a region 211 doped with an n-type or p-type impurity is formed. Note that in the case where a distance between a portion where the second contact plug 207 is in contact with the semiconductor region 208 and the word lines 210*a* and the 210*b*, or a distance between a portion where a third contact plug to be formed later is in contact with the semiconductor region 208 and the word lines 210*a* and 210*b* is less than or equal to 20 nm, preferably less than or equal to 10 nm, the region 211 subjected to doping is not necessarily formed.

In addition, in the case where the semiconductor region 208 has any conductivity type in advance, when the transistor can be controlled by using a difference in work function between the semiconductor region and the material included in the word lines 210*a* and 210*b*, the region 211 subjected doping is not necessarily formed. For example, even in the case where an impurity is not particularly added by doping in polycrystalline silicon on silicon oxide, the polycrystalline silicon exhibits n-type conductivity, and when a material having a work function of 5 eV or more, such as indium nitride, zinc nitride, or p-type silicon is used for the word lines 210*a* and 210*b*, electrons in polycrystalline silicon in the vicinities of the word lines 210*a* and 210*b* can be removed and thus a region having an extremely high resistivity can be formed.

Next, a third insulator 212 is formed using a material having a relatively low dielectric constant, such as silicon oxide, and third contact plugs 213*a* and 213*b* are formed. Further, a fourth insulator 214 is also formed using a material having low dielectric constant and holes for forming capacitors are provided therein.

Then, first capacitor electrodes 215*a* and 215*b* each having a thickness of 2 nm to 20 nm are formed over inner surfaces of the holes. Note that the upper limit of the thickness of each of the capacitor electrodes 215*a* and 215*b* is determined in accordance with the feature size F. When F is 20 nm, the thickness is preferably less than or equal to 5 nm; when F is 10 nm, the thickness is preferably less than or equal to 2.5 nm.

Figure 5A:
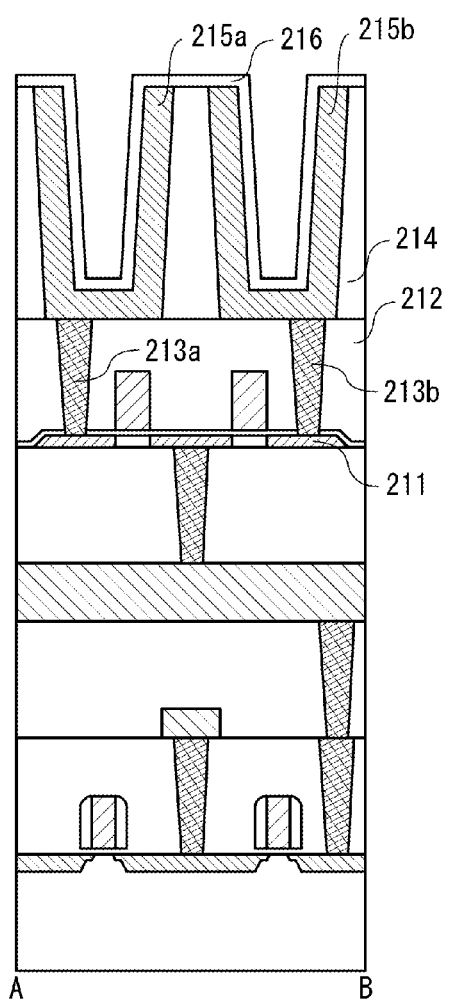
FIGS. 5A and 5B illustrate an example of a method for manufacturing a semiconductor memory device of the present invention.
Figure 5B:
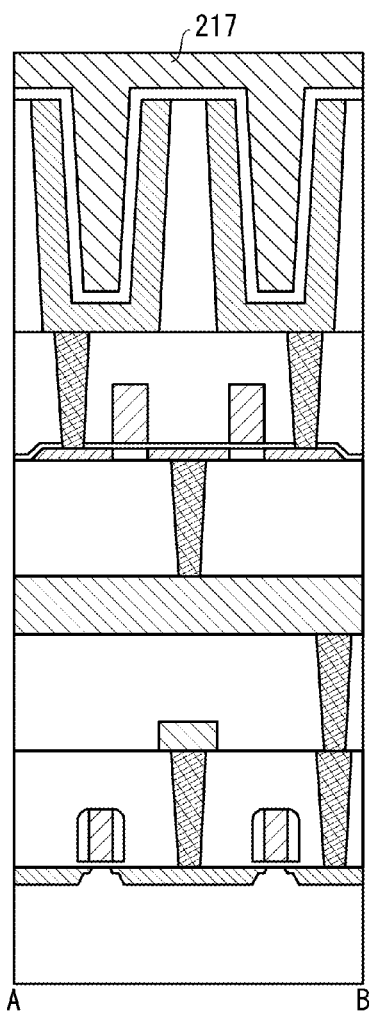

Next, as illustrated in FIG. 5A, a capacitor insulator 216 having a thickness of 2 nm to 20 nm is formed. As the capacitor insulator 216, any of various high-k materials can be used, and hafnium oxide, zirconium oxide, tantalum oxide, barium strontium titanate, or the like is preferably used.

In addition, a second capacitor electrode 217 is formed. In this embodiment, the second capacitor electrode 217 and the bit line 205 are formed to be parallel to each other. In this manner, the memory cell of the open-bit-line DRAM can be manufactured. Note that a fixed potential may be continuously applied to the second capacitor electrode 217, or a potential which is synchronized with the potential of the bit line 205 can be applied thereto. For example, as disclosed in Patent Document 6, a complementary potential having an opposite phase to the bit line may be applied.

(Embodiment 2)

FIGS. 7A to 7D and FIGS. 8A to 8D illustrate this embodiment. Although in this embodiment, a memory cell is formed over a semiconductor circuit including a sense amplifier as in Embodiment 1, the semiconductor circuit is omitted in FIGS. 7A to 7D and FIGS. 8A to 8D. Description is made below with reference to the drawings.

<FIG. 7A>

Figure 7A:
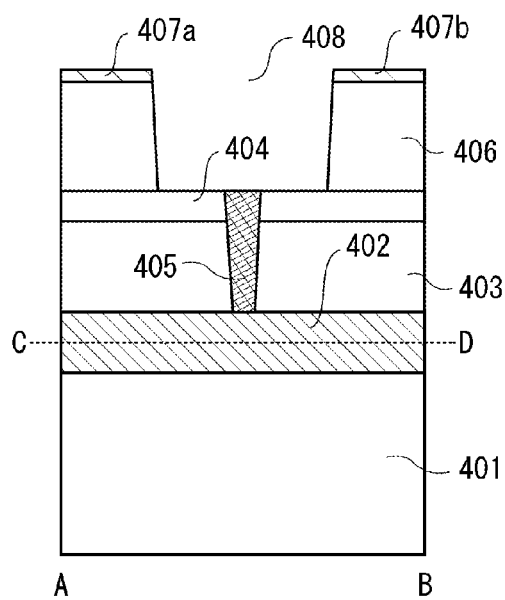
FIGS. 7A to 7D illustrate an example of a method for manufacturing a semiconductor memory device of the present invention.
Figure 7B:
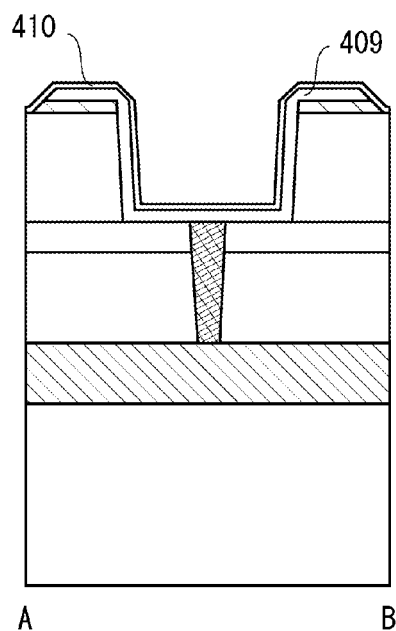
Figure 7C:
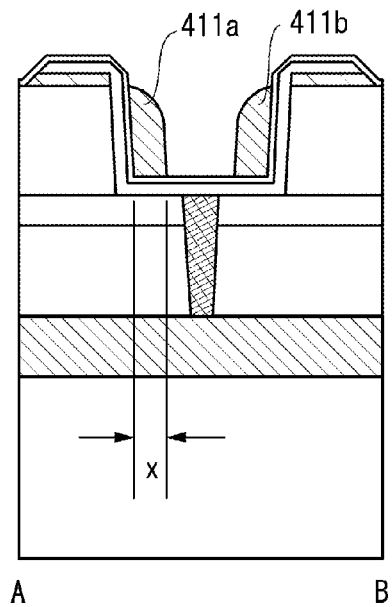
Figure 7D:
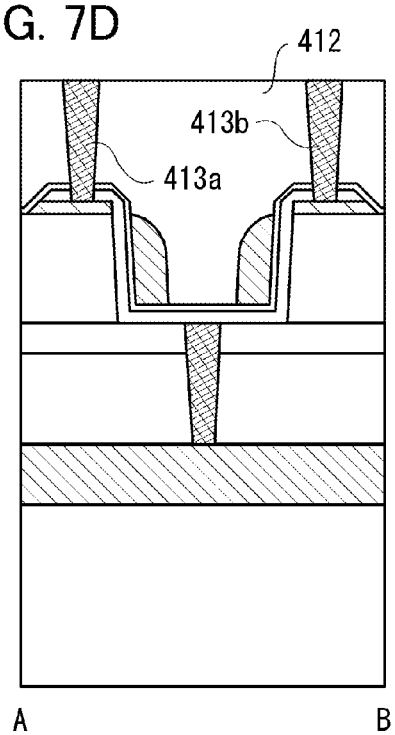
Figure 8A:
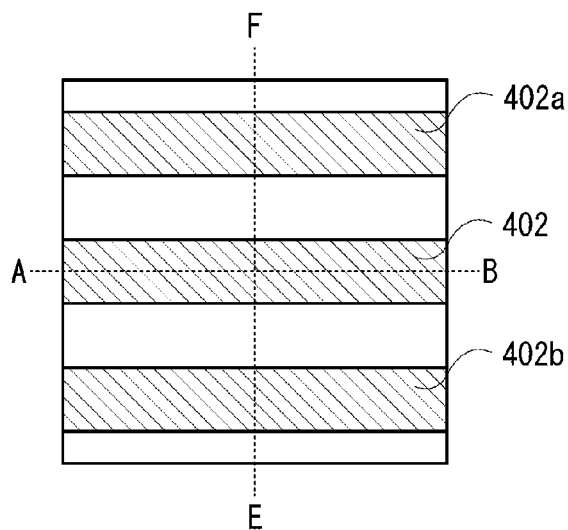
FIGS. 8A to 8D illustrate a structure example of a semiconductor memory device of the present invention.
Figure 8B:
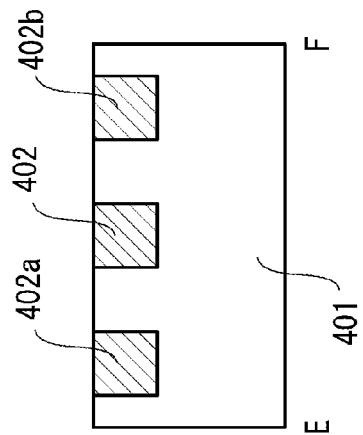

A bit line 402 is formed over a first insulator 401. At this time, there are some methods of arrangement of the bit line 402. For example, there is a method in which, as illustrated in FIGS. 8A and 8B, the bit line 402 and adjacent bit lines 402*a* and 402*b* are formed at the same depth or formed in the same layer. FIG. 8A is a schematic view of a cross section of a surface where the bit line 402 is formed, which is taken along a plane through line C-D of FIG. 7A, and FIG. 8B illustrates a cross section taken along line E-F of FIG. 8A. Note that cross sections along lines A-B of FIGS. 8A and 8C are illustrated in FIGS. 7A to 7D.

As illustrated in FIG. 8B, the bit lines 402*a* and 402*b* adjacent to the bit line 402 are formed at the same depth or in the same layer as the bit line 402. A feature of this arrangement is that the number of manufacturing steps is small.

Figure 8C:
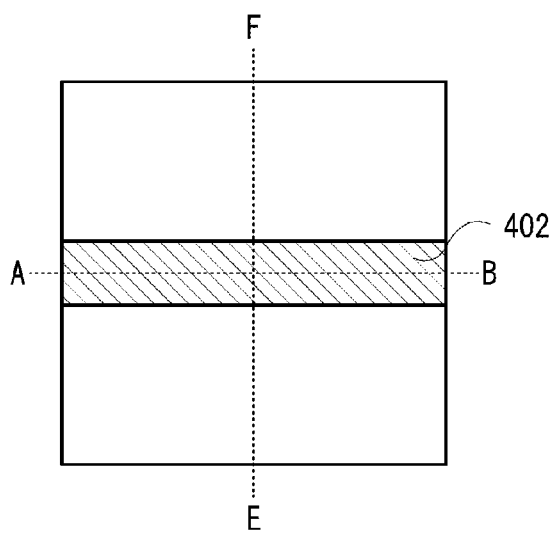
Figure 8D:
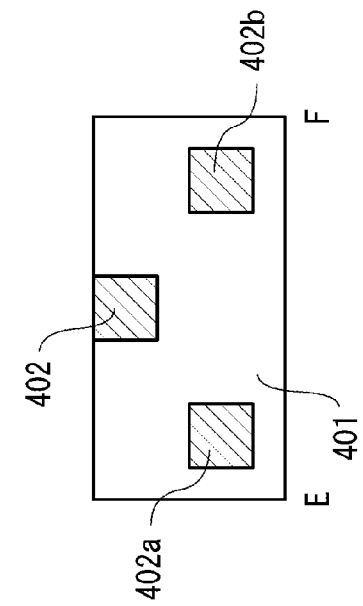

Another method is that the bit line 402 is formed at a different depth or in a different layer from that of the bit lines 402*a* and 402*b* adjacent to the bit line 402 as illustrated in FIGS. 8C and 8D. FIG. 8C is a schematic view of a cross section taken along a plane through line C-D of FIG. 7A, and FIG. 8D is a cross section taken along line E-F of FIG. 8C.

Although the bit lines 402*a* and 402*b* adjacent to the bit line 402 are not illustrated in FIG. 8C, the bit lines 402*a* and 402*b* adjacent to the bit line 402 are formed at a different depth from that of the bit line 402 as illustrated in FIG. 8D. An additional step is needed in this method but a parasitic capacitance between bit lines adjacent to each other can be reduced as compared to the method in which the bit lines are formed in the same layer. Although the bit lines are formed at two different depths in FIG. 8C, the bit lines may be formed at three or more different depths.

In a conventional DRAM, a structure such as a capacitor exists in a portion where a bit line is provided and the arrangement of bit lines is extremely limited. However, in this embodiment, the capacitor is formed in a position apart from the bit line, and thus the degree of freedom of the arrangement of the bit lines is high and the bit lines can be formed at different depths as described above. Any of the methods can be used in this embodiment.

Next, a second insulator 403 and a third insulator 404 are formed. The second insulator 403 and the third insulator 404 are formed using different kinds of materials or materials having different etching rates. For example, silicon oxide and silicon nitride can be used as the second insulator 403 and the third insulator 404, respectively. Then, a first contact plug 405 connected to the bit line 402 is embedded in the second insulator 403 and the third insulator 404.

Next, an insulator and a conductive layer are formed and etched into a grooved shape, so that a groove 408, and a fourth insulator 406 and conductive layers 407*a* and 407*b* which are separated by the groove 408 are formed. At this time, the etching is stopped at the third insulator. In other words, the third insulator serves as an etching stopper.

<FIG. 7B>

Next, a semiconductor film is formed over a bottom surface and at side surfaces of the groove 408, the semiconductor film and the conductive layers 407*a* and 407*b* are etched, and an island-shaped semiconductor region 409 is formed. In addition, a gate insulator 410 is formed over the semiconductor region 409.

<FIG. 7C>

After that, a film of a conductive material is formed and subjected to anisotropic etching, whereby word lines 411a and 411b which are in contact with part of the gate insulator 410 at the side surfaces of the groove 408 are formed. Patent Document 4 may be referred to for a method such that the word lines 411a and 411b are formed at the side surfaces of the groove. As disclosed in Patent Document 4, an impurity may be added to a semiconductor region using the word lines 411a and 411b as masks.

The transistors including the word lines 411a and 411b can each have a channel length larger than the feature size. In other words, the channel length is about the sum of the depth of the groove 408 and the length of the word line 411a (or the word line 411b) in the horizontal direction (indicated by x in FIG. 7C). When the depth of the groove 408 is larger than the feature size, the channel length is larger than the feature size, so that a short-channel effect can be suppressed.

In addition, the length x can be determined irrespective of the feature size. For example, when a necessary conductivity is ensured, the length x can be one half or less of the feature size, preferably one fourth or less of the feature size. At this time, the width of the groove 408 can be two times or more of the feature size, preferably equal to the feature size. As a result, the area of one memory cell can be $5F^2$, preferably $4F^2$.

For example, when the width of the groove 408 is 2F and the length x is preferably less than or equal 0.5F, the word lines 411a and 411b which are formed in the same groove 408 can be separated from each other. As a result, a length needed for one memory cell is 2.5F, and the area of one memory cell can be $5F^2$ which is the product of 2.5F and 2F which is a length (distance between bit lines) in a direction perpendicular to the line A-B (i.e., in a direction of the line E-F in FIGS. 8A to 8D).

Alternatively, when the width of the groove 408 is F and the length x is preferably less than or equal to 0.25F, the word lines 411a and 411b which are formed in the same groove 408 can be separated from each other. As a result, a length needed for one memory cell is 2F, and the area of one memory cell can be $4F^2$. This is a theoretical lower limit of a matrix memory cell allay.

Note that providing the bit line 402 below the transistor makes it possible to obtain higher density and a smaller area as described above. If the bit line is provided over the word line, a larger area is necessary even when a method in which the word line is formed at the side surface of the groove 408 is employed. This is because it is necessary to provide a contact with the bit line in addition to a contact to the word line in the groove 408. Since the word lines should not be in contact with each other, it is indispensable that the width of the groove 408 is larger than F, actually larger than 2F.

<FIG. 7D>

A fifth insulator 412 is formed, and further, second contact plugs 413a and 413b connected to the conductive layers 407a and 407b are formed. A capacitor may be formed over the second contact plugs 413a and 413b as described in Embodiment 1. The conductive layers 407a and 407b each function as an etching stopper, and the function is more effective when the semiconductor region 409 has a small thickness. After that, the capacitor may be formed using the method described using FIGS. 5A and 5B.

This application is based on Japanese Patent Application serial No. 2011-020734 filed with Japan Patent Office on Feb. 2, 2011, the entire contents of which are hereby incorporated by reference.

What is claimed is:

1. A semiconductor memory device comprising a memory cell array, the memory cell array comprising:
   a first sense amplifier circuit and a second sense amplifier circuit;
   first to fourth bit lines, an end of the first bit line and an end of the second bit line being electrically connected to the first sense amplifier circuit, and an end of the third bit line and an end of the fourth bit line being electrically connected to the second amplifier circuit;
   an island-shaped semiconductor region over the first bit line;
   a gate insulator over the island-shaped semiconductor region;
   two word lines over the gate insulator and the island-shaped semiconductor region; and
   a capacitor overlapping the island-shaped semiconductor region, over the two word lines,
   wherein the third bit line is provided between the end of the first bit line and the end of the second bit line over the first sense amplifier circuit, and
   wherein the second bit line is provided between the end of the third bit line and the end of the fourth bit line over the second sense amplifier circuit.

2. The semiconductor memory device according to claim 1, further comprising:
   an electrode for connection with the first bit line, the electrode being provided between regions of the island-shaped semiconductor region over the two word lines.

3. The semiconductor memory device according to claim 1, further comprising a circuit for driving the memory cell array below the first bit line.

4. The semiconductor memory device according to claim 1, wherein the island-shaped semiconductor region includes a portion at a side surface of a recessed portion or a side surface of a projected portion.

5. The semiconductor memory device according to claim 1, wherein the first to fourth bit lines are formed in at least two different layers.

6. The semiconductor memory device according to claim 1, wherein the island-shaped semiconductor region includes an oxide semiconductor.

7. The semiconductor memory device according to claim 1, wherein the first bit line is connected to the island-shaped semiconductor region through a plug interposed between a top surface of the first bit line and a bottom surface of the island-shaped semiconductor region.

8. A semiconductor memory device comprising a memory cell array, the memory cell array comprising:
   a first sense amplifier circuit and a second sense amplifier circuit;
   first to fourth bit lines, an end of the first bit line and an end of the second bit line being electrically connected to the first sense amplifier circuit, and an end of the third bit line and an end of the fourth bit line being electrically connected to the second amplifier circuit;
   an island-shaped semiconductor region over the first bit line;
   a gate insulator over the island-shaped semiconductor region;
   two word lines over the gate insulator and the island-shaped semiconductor region; and a capacitor overlapping the island-shaped semiconductor region, wherein the third bit line is provided between the end of the first bit line and the end of the second bit line over the first sense amplifier circuit, wherein the second bit line is provided between the end of the third bit line and the end of the fourth bit line over the second sense amplifier circuit, and wherein an area of the island-shaped semiconductor region that overlaps with the first bit line occupies 80% or more of an area of the island-shaped semiconductor region.

9. The semiconductor memory device according to claim 8, further comprising:

an electrode for connection with the first bit line, the electrode being provided between regions of the island-shaped semiconductor region over the two word lines.

10. The semiconductor memory device according to claim 8, further comprising a circuit for driving the memory cell array below the first bit line.

11. The semiconductor memory device according to claim 8, wherein the island-shaped semiconductor region includes a portion at a side surface of a recessed portion or a side surface of a projected portion.

12. The semiconductor memory device according to claim 8, wherein the first to fourth bit lines are formed in at least two different layers.

13. The semiconductor memory device according to claim 8, wherein the island-shaped semiconductor region includes an oxide semiconductor.

14. The semiconductor memory device according to claim 8, wherein the first bit line is connected to the island-shaped semiconductor region through a plug interposed between a top surface of the first bit line and a bottom surface of the island-shaped semiconductor region.

15. A semiconductor memory device comprising a memory cell array, the memory cell array comprising:

a first sense amplifier circuit and a second amplifier circuit;

first to fourth bit lines, an end of the first bit line and an end of the second bit line being electrically connected to the first sense amplifier circuit, and an end of the third bit line and an end of the fourth bit line being electrically connected to the second amplifier circuit;

an island-shaped semiconductor region over the first bit line;

a gate insulator over the island-shaped semiconductor region;

two word lines over the gate insulator and the island-shaped semiconductor region; and a capacitor over the island-shaped semiconductor region, wherein the third bit line is provided between the end of the first bit line and the end of the second bit line over the first sense amplifier circuit, wherein the second bit line is provided between the end of the third bit line and the end of the fourth bit line over the second sense amplifier circuit, and wherein the bit lines do not cross over one another.

16. The semiconductor memory device according to claim 15, further comprising an electrode for connection with the first bit line, the electrode being provided between regions of the island-shaped semiconductor region over the two word lines.

17. The semiconductor memory device according to claim 15, further comprising a circuit for driving the memory cell array below the first bit lines.

18. The semiconductor memory device according to claim 15, wherein the island-shaped semiconductor region includes a portion at a side surface of a recessed portion or a side surface of a projected portion.

19. The semiconductor memory device according to claim 15, wherein the first to fourth bit lines are formed in at least two different layers.

20. The semiconductor memory device according to claim 15, wherein the island-shaped semiconductor region includes an oxide semiconductor.

* * * * *